(12) United States Patent
Kyono et al.

(10) Patent No.: US 10,024,516 B2
(45) Date of Patent: Jul. 17, 2018

(54) OPTICAL MODULE

(71) Applicant: Sumitomo Electric Industries, Ltd., Osaka-shi (JP)

(72) Inventors: Takashi Kyono, Itami (JP); Hiromi Nakanishi, Itami (JP); Hideyuki Ijiri, Itami (JP); Kaoru Shibata, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/644,293

(22) Filed: Jul. 7, 2017

(65) Prior Publication Data

US 2018/0010763 A1    Jan. 11, 2018

(30) Foreign Application Priority Data

Jul. 8, 2016   (JP) .................. 2016-136331

(51) Int. Cl.
*F21V 3/02* (2006.01)
*F21V 15/01* (2006.01)
*F21V 17/10* (2006.01)
*F21Y 115/30* (2016.01)

(52) U.S. Cl.
CPC ............. *F21V 3/02* (2013.01); *F21V 15/01* (2013.01); *F21V 17/101* (2013.01); *F21Y 2115/30* (2016.08)

(58) Field of Classification Search
CPC ................. F21V 3/02; F21V 15/01
USPC .............................................. 362/374
See application file for complete search history.

(56) References Cited

FOREIGN PATENT DOCUMENTS

| JP | H07-176825 A | 7/1995 |
|---|---|---|
| JP | 2002-033519 A | 1/2002 |
| JP | 2007-324412 A | 12/2007 |
| JP | 2010-182988 A | 8/2010 |
| JP | 2016-096219 A | 5/2016 |

*Primary Examiner* — Toan Ly
(74) *Attorney, Agent, or Firm* — Venable LLP; Michael A. Sartori; Miguel A. Lopez

(57) ABSTRACT

An optical module includes a transmitting member. The transmitting member is fixed to a cap member so as to cover a through-hole. On the assumption that the height of one point on a first surface in a state in which the transmitting member is detached from the cap member is zero and the direction toward the outside of the optical module is a positive direction, the amount of warp that is a difference between the displacement at the central point and the displacement at a standard point, on the first surface, corresponding to a reference point, on the projection image, away from a center of gravity by a particular distance is different between a first geodesic line and a second geodesic line, the displacement being a height of the one point in a direction of the optical axis in a state in which the transmitting member is fixed to the cap member. The transmitting member is joined to the cap member at the first surface or the second surface.

11 Claims, 10 Drawing Sheets

OPTICAL MODULE

BACKGROUND OF THE INVENTION

1. Field of the Invention

The present invention relates to an optical module.

This application claims priority based on Japanese Patent Application No. 2016-136331 filed in the Japan Patent Office on Jul. 8, 2016, the entire contents of which are incorporated herein by reference.

2. Description of the Related Art

Optical modules are used as light sources for various apparatuses such as display apparatuses, optical pickup apparatuses, and optical communication apparatuses. There are known optical modules including a light-emitting device that generates laser light and a protective member that accommodates the light-emitting device (e.g., refer to Japanese Unexamined Patent Application Publication No. 2007-324412). The protective member includes a transmitting member that transmits laser light.

SUMMARY OF THE INVENTION

An optical module according to an aspect of the present invention includes a main member including an optical semiconductor device and a protective member that surrounds the main member. The protective member includes a base member, a cap member, and a transmitting member. The base member supports the main member. The cap member has a through-hole, covers the main member, and is joined to the base member. The transmitting member is fixed to the cap member so as to cover the through-hole and formed of a material that transmits light with a wavelength corresponding to the optical semiconductor device. The transmitting member has a first surface and a second surface which light enters or from which light is output. In a case where a first axis and a second axis are set that are orthogonal to each other at a center of gravity of a projection image obtained by projecting the transmitting member on a plane perpendicular to an optical axis of the optical module, a geodesic line on the first surface corresponding to the first axis is defined as a first geodesic line, a geodesic line on the first surface corresponding to the second axis is defined as a second geodesic line, and a point on the first surface corresponding to the center of gravity is defined as a central point, when a height of one point on the first surface in a state in which the transmitting member is detached from the cap member is zero and a direction toward an outside of the optical module is a positive direction, an amount of warp that is a difference between a displacement at the central point and a displacement at a standard point, on the first surface, corresponding to a reference point, on the projection image, away from the center of gravity by a particular distance is different between the first geodesic line and the second geodesic line, the displacement being a height of the one point in a direction of the optical axis in a state in which the transmitting member is fixed to the cap member. The transmitting member is joined to the cap member at the first surface or the second surface.

DESCRIPTION OF THE PREFERRED EMBODIMENTS

Technical Problem in known optical modules, a transmitting member that transmits laser light is attached to a protective member. However, such a transmitting member cracks and troubles sometimes occur.

Accordingly, it is one of objects of the present invention to provide an optical module in which cracking of a transmitting member can be suppressed.

Advantageous Effect

According to an embodiment of the present invention, there can be provided an optical module in which cracking of a transmitting member can be suppressed.

Description of Embodiments

First, embodiments of the present invention will be listed and described. The optical module according to an embodiment of the present invention includes a main member including an optical semiconductor device and a protective member that surrounds the main member. The protective member includes a base member, a cap member, and a transmitting member. The base member supports the main member. The cap member has a through-hole, covers the main member, and is joined to the base member. The transmitting member is fixed to the cap member so as to cover the through-hole and is formed of a material that transmits light with a wavelength corresponding to the optical semiconductor device.

The transmitting member has a first surface and a second surface which light enters or from which light is output. In the case where a first axis and a second axis are set that are orthogonal to each other at a center of gravity of a projection image obtained by projecting the transmitting member on a plane perpendicular to an optical axis of the optical module, a geodesic line on the first surface corresponding to the first axis is defined as a first geodesic line, a geodesic line on the first surface corresponding to the second axis is defined as a second geodesic line, and a point on the first surface corresponding to the center of gravity is defined as a central point, when a height of one point on the first surface in a state in which the transmitting member is detached from the cap member is zero and a direction toward an outside of the optical module is a positive direction, an amount of warp that is a difference between a displacement at the central point and a displacement at a standard point, on the first surface, corresponding to a reference point, on the projection image, away from the center of gravity by a particular distance is different between the first geodesic line and the second geodesic line, the displacement being a height of the one point in a direction of the optical axis in a state in which the transmitting member is fixed to the cap member. The transmitting member is joined to the cap member at the first surface or the second surface.

In the above optical module, the base member and the cap member constituting the protective member are joined to each other such that the main member is housed in the protective member. Herein, the cap member is joined to the base member while being deformed from its original shape to a certain degree. The deformation of the cap member causes distortion, and the transmitting member fixed to the cap member is also distorted.

As a result of studies conducted by the present inventors, they have found that when the distortion in the transmitting member is uneven, the transmitting member easily cracks. However, to achieve even distortion of the transmitting member, the shape of the cap member is restricted. The position of the through-hole formed in the cap member to which the transmitting member is to be fixed is also restricted. This impairs the degree of design freedom of optical modules. To maintain the degree of design freedom of optical modules, the transmitting member preferably does not crack even when the distortion caused on the transmitting member is uneven. As a result of studies conducted by the present inventors to address the problem, they have found that cracking of the transmitting member is suppressed by joining the transmitting member to the cap member at an appropriate position even when the distortion on the transmitting member is uneven.

In the optical module according to an embodiment of the present invention, the transmitting member has a first surface and a second surface which light enters or from which light is output. In the case where a first axis and a second axis are set that are orthogonal to each other at a center of gravity of a projection image obtained by projecting the transmitting member on a plane perpendicular to an optical axis of the optical module, a geodesic line on the first surface corresponding to the first axis is defined as a first geodesic line, a geodesic line on the first surface corresponding to the second axis is defined as a second geodesic line, and a point on the first surface corresponding to the center of gravity is defined as a central point, the amount of warp on the first geodesic line is different from the amount of warp on the second geodesic line. That is, the transmitting member is unevenly distorted in a non-concentric manner.

In the optical module according to an embodiment of the present invention, the transmitting member is joined to the cap member at the first surface or the second surface. Thus, cracking of the transmitting member is suppressed despite the fact that the transmitting member has uneven distortion.

The transmitting member may be formed of glass. When the transmitting member is formed of glass, a transmitting member having high durability and high airtightness (sealing property) can be provided.

The cap member may have a side surface including a region joined to the base member and a top surface connected to the side surface at a region opposite to the region joined to the base member. The through-hole may be formed in the side surface. When a through-hole is formed in the side surface of the cap member having such a shape, the transmitting member tends to have uneven distortion. The optical module according to an embodiment of the present invention is suitably employed when a cap member has such a structure.

The cap member may have a hollow rectangular parallelepiped shape having an opening at one surface. The cap member having such a shape is suitable for decreasing the size of the optical module.

The maximum value of the amount of warp in a region, on the first surface, corresponding to a region, on the projection image, having a radius of 300 m from the center of gravity of the projection image may be 0.03 µm or more and 0.15 µm or less. When the maximum value of the amount of warp is within the above range, cracking of the transmitting member can be suppressed with more certainty.

In the optical module according to an embodiment of the present invention, both of an amount of warp on the first geodesic line and an amount of warp on the second geodesic line may be positive or negative. This state refers to a state in which the transmitting member is uniformly convex or concave. In this state, cracking of the transmitting member can be suppressed with more certainty.

In the optical module according to an embodiment of the present invention, one of an amount of warp on the first geodesic line and an amount of warp on the second geodesic line may be positive, and the other may be negative. In this state, the transmitting member is distorted into, for example, a saddle-like shape. In this state, the airtightness (sealing property) of the optical module can be improved.

The transmitting member may be joined to the cap member with a low melting point glass disposed therebetween. When the transmitting member is joined to the cap member using a low melting point glass, the transmitting member can be easily fixed to the cap member, and also high airtightness (sealing property) can be achieved.

In the transmitting member, the area of a joining region that is a region joined to the cap member may be 60% or more of an area of a surface having the joining region, the surface being one of the first surface and the second surface. When the fraction of the area of the joining region is higher than or equal to the above value, cracking of the transmitting member can be suppressed with more certainty.

In the transmitting member, the area of a joining region that is a region joined to the cap member may be 80% or less of an area of a surface having the joining region, the surface being one of the first surface and the second surface. When the fraction of the area of the joining region is lower than or equal to the above value, a region through which light passes in the cap member is sufficiently large.

In the optical module, the optical semiconductor device may be a laser diode. Thus, light having less variation in wavelengths can be emitted.

DETAILS OF EMBODIMENTS

Figure 1:
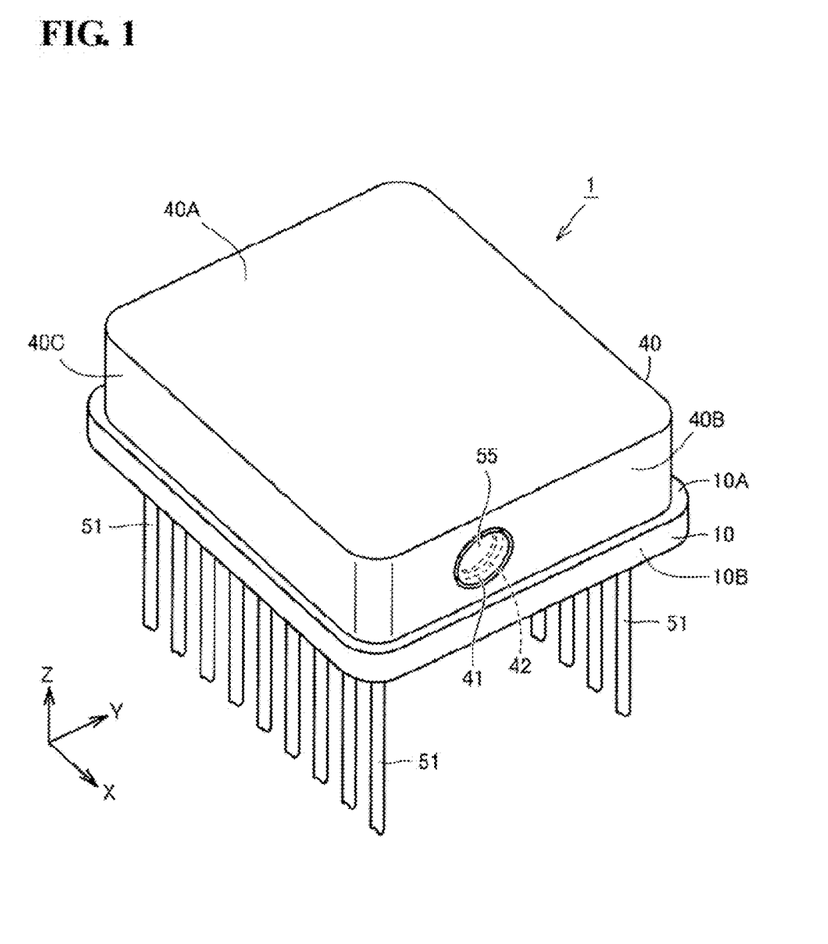
FIG. 1 is a schematic perspective view illustrating a structure of an optical module.
Figure 2:
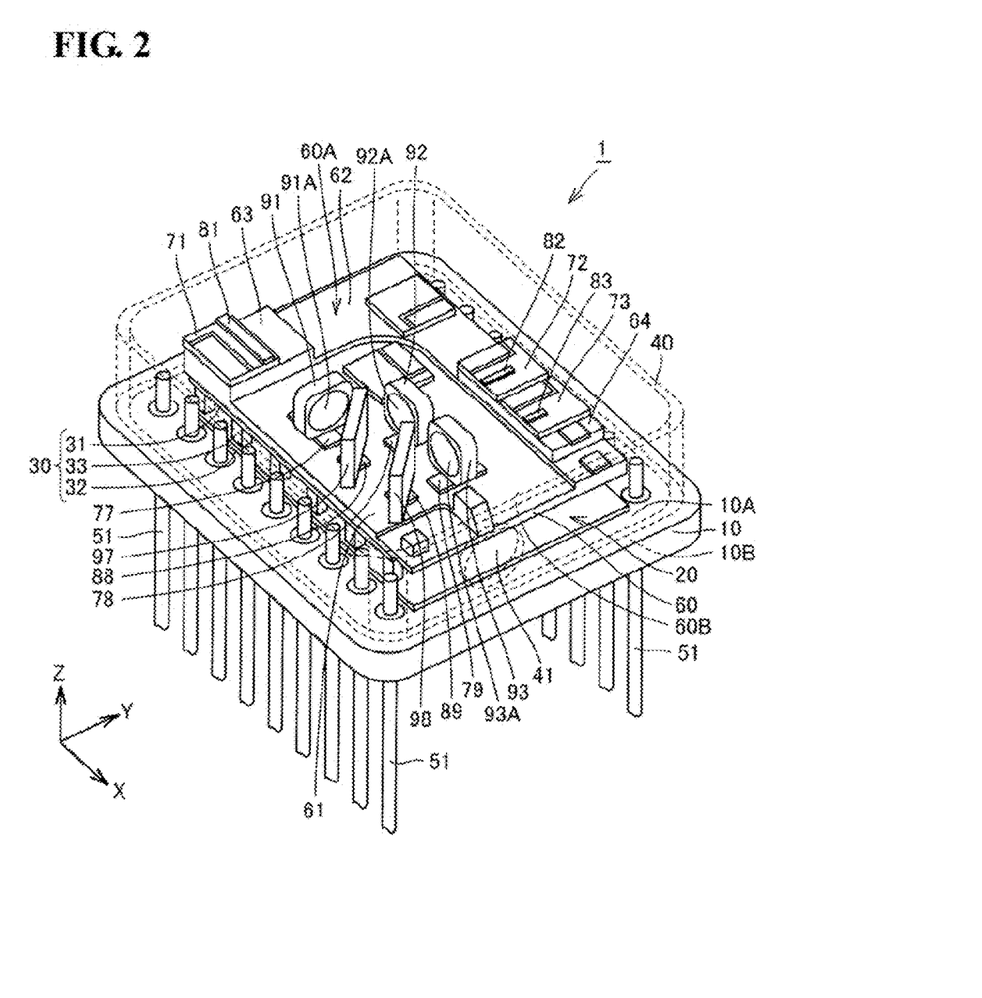
FIG. 2 is a schematic perspective view illustrating a structure of an optical module.
Figure 3:
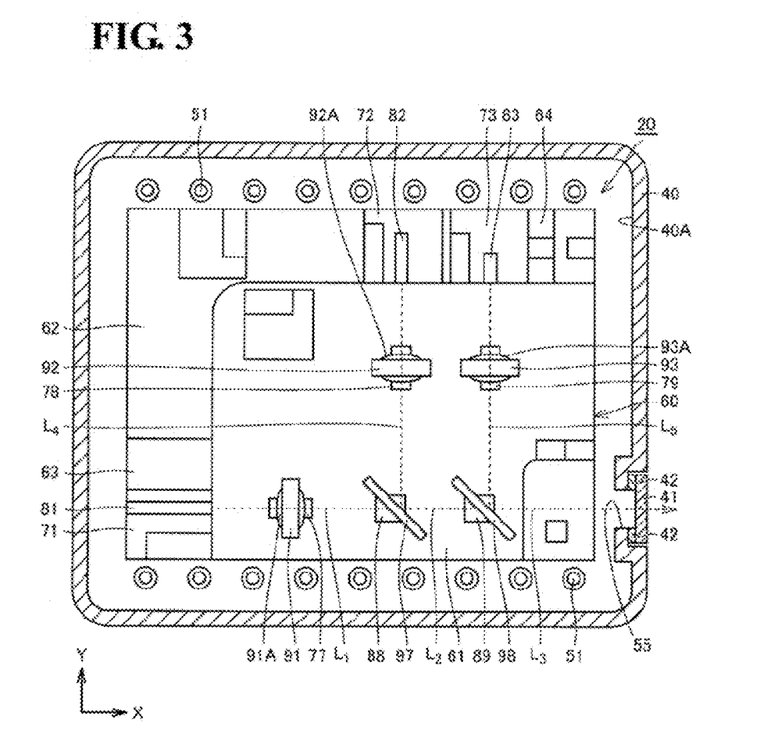
FIG. 3 is a schematic plan view illustrating a structure of an optical module.

Hereafter, an optical module according to an embodiment of the present invention will be described with reference to FIG. 1 to FIG. 3. FIG. 1 is a schematic perspective view illustrating a structure of an optical module 1 according to this embodiment. FIG. 2 is a schematic perspective view illustrating a state in which a cap member 40 in FIG. 1 is detached. FIG. 3 is a schematic plan view corresponding to the schematic perspective view in FIG. 2. In the drawings below, the same or corresponding elements are denoted by the same reference numerals and repetitive descriptions thereof are omitted.

Referring to FIG. 1 and FIG. 2, an optical module 1 according to this embodiment includes a main member 20 that includes laser diodes 81, 82, and 83 serving as optical semiconductor devices and a protective member that surrounds the main member 20. The protective member includes a stem 10 serving as a base member, a cap member 40, and a transmitting member 41. The stem 10 serving as a base member has a flat-plate shape and supports the main member 20. The cap member 40 has a through-hole 55. The cap member 40 covers the main member 20 and is joined to the stem 10. The cap member 40 has side surfaces 40B and 40C including a region joined to the stem 10 and a top surface 40A connected to the side surfaces 40B and 40C at a region opposite to the region joined to the stem 10. The through-hole 55 is formed in the side surface 40B of the cap member 40. The cap member 40 has a hollow rectangular parallelepiped shape having an opening on the side on which the cap member 40 is joined to the stem 10. The optical module 1 further includes a plurality of lead pins 51 that extend through the stem 10 to one main surface 10A side from the other main surface 10B side so as to protrude from both of the one main surface 10A and the other main surface 10B. The stem 10 and the cap member 40 are, for example, welded together to provide a hermetically sealed state. That is, the main member 20 is hermetically sealed by the stem 10 and the cap member 40. A space surrounded by the stem 10 and the cap member 40 is filled with a gas whose moisture content is reduced (moisture is removed), such as dry air.

A transmitting member 41 is fixed to the cap member 40 so as to cover the through-hole 55. The transmitting member 41 is formed of a material that transmits rays of light with wavelengths corresponding to the optical semiconductor devices (rays of light emitted from the laser diodes 81, 82, and 83). In this embodiment, the material that transmits rays of light with wavelengths corresponding to the optical semiconductor devices is glass. The transmitting member 41 may have a flat-plate shape in which the main surfaces are parallel to each other or may have a lens shape in which light from the main member 20 is condensed or diffused.

Referring to FIG. 2 and FIG. 3, the main member 20 includes a plate-shaped substrate 60. The substrate 60 has one main surface 60A having a rectangular shape in plan view. The substrate 60 includes a base region 61 and a chip mounted region 62. The chip mounted region 62 is a region including one short side of the one main surface 60A and one long side connected to the one short side. The chip mounted region 62 has a thickness larger than that of the base region 61. Consequently, the chip mounted region 62 is taller than the base region 61. The chip mounted region 62 includes a first chip mounted region 63 on a side opposite to the side at which the one short side is connected to the one long side. The first chip mounted region 63 has a larger thickness (taller) than the adjacent region. The chip mounted region 62 also includes a second chip mounted region 64 on a side opposite to the side at which the one long side is connected to the one short side. The second chip mounted region 64 has a larger thickness (taller) than the adjacent region.

A first submount 71 having a flat-plate shape is disposed on the first chip mounted region 63. A red laser diode 81 serving as a first optical semiconductor device is disposed on the first submount 71. A second submount 72 and a third submount 73 each having a flat-plate shape are disposed on the second chip mounted region 64. The third submount 73 is disposed farther from the connecting portion between the one long side and the one short side than the second submount 72. A green laser diode 82 serving as a second optical semiconductor device is disposed on the second submount 72. A blue laser diode 83 serving as a third optical semiconductor device is disposed on the third submount 73. The heights of the optical axes of the red laser diode 81, the green laser diode 82, and the blue laser diode 83 (the distances between each optical axis and a reference surface that is the one main surface 60A of the substrate 60, that is, the distances from the reference surface in the Z-axis direction) are adjusted to be the same by using the first submount 71, the second submount 72, and the third submount 73.

The optical module 1 includes an electronic cooling module 30 between the stem 10 and the main member 20. The electronic cooling module 30 includes a heat absorption plate 31, a heat dissipation plate 32, and semiconductor pillars 33 arranged between electrodes disposed on the heat absorption plate 31 and the heat dissipation plate 32. The heat absorption plate 31 and the heat dissipation plate 32 are formed of, for example, alumina. The heat absorption plate 31 is disposed so as to be in contact with the other main surface 60B of the substrate 60. The heat dissipation plate 32 is disposed so as to be in contact with the one main surface 10A of the stem 10. In this embodiment, the electronic cooling module 30 is a Peltier module (Peltier device). By passing an electric current through the electronic cooling module 30, heat in the substrate 60 that is in contact with the heat absorption plate 31 moves to the stem 10, which cools the substrate 60. As a result, an increase in the temperatures of the red laser diode 81, the green laser diode 82, and the blue laser diode 83 is suppressed. Thus, the optical module 1 can be used in a high-temperature environment such as an environment in automobiles. Furthermore, light with a desired color can be precisely generated by maintaining the temperatures of the red laser diode 81, the green laser diode 82, and the blue laser diode 83 within appropriate ranges.

A first lens support member 77, a second lens support member 78, and a third lens support member 79 are formed on the base region 61 of the substrate 60. A first lens 91, a second lens 92, and a third lens 93 are disposed on the first lens support member 77, the second lens support member 78, and the third lens support member 79, respectively. The first lens 91, the second lens 92, and the third lens 93 are respectively fixed to the first lens support member 77, the second lens support member 78, and the third lens support member 79 through adhesion with, for example, a resin-curable adhesive.

The first lens 91, the second lens 92, and the third lens 93 include lens units 91A, 92A, and 93A each having a lens surface. In the first lens 91, the second lens 92, and the third lens 93, the lens units 91A, 92A, and 93A and regions other than the lens units 91A, 92A, and 93A are respectively formed in one piece. The central axes of the lens units 91A, 92A, and 93A of the first lens 91, the second lens 92, and the third lens 93, that is, the optical axes of the lens units 91A, 92A, and 93A are respectively adjusted by the first lens support member 77, the second lens support member 78, and the third lens support member 79 so as to be in line with the optical axes of the red laser diode 81, the green laser diode 82, and the blue laser diode 83. The first lens 91, the second lens 92, and the third lens 93 are configured to convert the spot sizes of rays of light emitted from the red laser diode 81, the green laser diode 82, and the blue laser diode 83, respectively.

A first filter 97 and a second filter 98 are disposed on the base region 61 of the substrate 60. The first filter 97 and the second filter 98 are fixed to the base region 61 through adhesion with, for example, a resin-curable adhesive. The first filter 97 and the second filter 98 each have a flat-plate shape having main surfaces parallel to each other. The first filter 97 and the second filter 98 are, for example, wavelength selective filters. The first filter 97 and the second filter 98 are dielectric multilayer film filters. More specifically, the first filter 97 transmits red light and reflects green light. The second filter 98 transmits red light and green light and reflects blue light. The first filter 97 and the second filter 98 selectively transmit or reflect light with a particular wavelength. As a result, the first filter 97 and the second filter 98 multiplex rays of light emitted from the red laser diode 81, the green laser diode 82, and the blue laser diode 83. The first filter 97 and the second filter 98 are respectively disposed on a first protruding region 88 and a second protruding region 89, which are protrusions formed on the base region 61.

Referring to FIG. 3, the red laser diode 81, the lens unit 91A of the first lens 91, the first filter 97, and the second filter 98 are arranged in a straight line in the light-emitting direction of the red laser diode 81 (in the X-axis direction). The green laser diode 82, the lens unit 92A of the second lens 92, and the first filter 97 are arranged in a straight line in the light-emitting direction of the green laser diode 82 (in the Y-axis direction). The blue laser diode 83, the lens unit 93A of the third lens 93, and the second filter 98 are arranged in a straight line in the light-emitting direction of the blue laser diode 83 (in the Y-axis direction). In other words, the light-emitting direction of the red laser diode 81 intersects the light-emitting directions of the green laser diode 82 and the blue laser diode 83. More specifically, the light-emitting direction of the red laser diode 81 is orthogonal to the light-emitting directions of the green laser diode 82 and the blue laser diode 83. The light-emitting direction of the green laser diode 82 is the same as the light-emitting direction of the blue laser diode 83. More specifically, the light-emitting direction of the green laser diode 82 and the light-emitting direction of the blue laser diode 83 are parallel to each other. The main surfaces of the first filter 97 and the second filter 98 incline with respect to the light-emitting direction of the red laser diode 81. More specifically, the main surfaces of the first filter 97 and the second filter 98 incline at 45° with respect to the light-emitting direction of the red laser diode 81 (X-axis direction).

Hereafter, an operation of the optical module 1 according to this embodiment will be described. Referring to FIG. 3, red light emitted from the red laser diode 81 travels along an optical path $L_1$ and enters the lens unit 91A of the first lens 91, so that the spot size of light is converted. Specifically, for example, red light emitted from the red laser diode 81 is converted into collimated light. The red light whose spot size has been converted at the first lens 91 travels along the optical path $L_1$ and enters the first filter 97. Since the first filter 97 transmits red light, the light emitted from the red laser diode 81 further travels along an optical path $L_2$ and enters the second filter 98. Since the second filter 98 transmits red light, the light emitted from the red laser diode 81 further travels along an optical path $L_3$ and is output to the outside of the optical module 1 through the transmitting member 41 of the cap member 40.

Green light emitted from the green laser diode 82 travels along an optical path $L_4$ and enters the lens unit 92A of the second lens 92, so that the spot size of light is converted. Specifically, for example, green light emitted from the green laser diode 82 is converted into collimated light. The green light whose spot size has been converted at the second lens 92 travels along the optical path $L_4$ and enters the first filter 97. Since the first filter 97 reflects green light, the light emitted from the green laser diode 82 joins the optical path $L_2$. As a result, the green light is multiplexed with the red light, and travels along the optical path $L_2$ and enters the second filter 98. Since the second filter 98 transmits green light, the light emitted from the green laser diode 82 further travels along the optical path $L_3$ and is output to the outside of the optical module 1 through the transmitting member 41 of the cap member 40.

Blue light emitted from the blue laser diode 83 travels along an optical path $L_3$ and enters the lens unit 93A of the third lens 93, so that the spot size of light is converted. Specifically, for example, blue light emitted from the blue laser diode 83 is converted into collimated light. The blue light whose spot size has been converted at the third lens 93 travels along the optical path $L_5$ and enters the second filter 98. Since the second filter 98 reflects blue light, the light emitted from the blue laser diode 83 joins the optical path $L_3$. As a result, the blue light is multiplexed with the red light and the green light, and travels along the optical path $L_3$ and is output to the outside of the optical module 1 through the transmitting member 41 of the cap member 40.

Structures of Cap Member 40 and Transmitting Member 41

Figure 4:
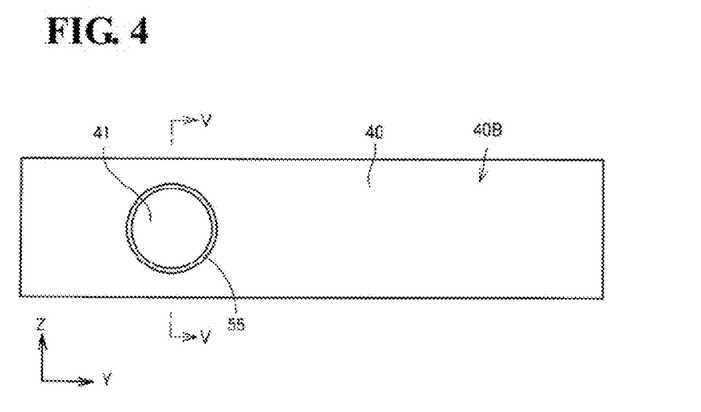
FIG. 4 is a schematic plan view illustrating a structure of a side surface of a cap member having a through-hole.
Figure 5:
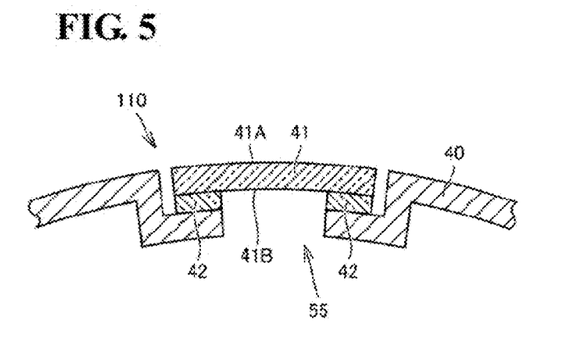
FIG. 5 is a schematic sectional view taken along line V-V in FIG. 4 and viewed in a direction of an arrow.

Hereafter, the structures of the cap member 40 and the transmitting member 41 will be described with reference to FIG. 4 and FIG. 5. FIG. 4 is a schematic plan view illustrating a structure of the cap member 40 when the side surface 40B is viewed in plan. FIG. 5 is a schematic sectional view taken along line V-V in FIG. 4 and viewed in a direction of an arrow. Referring to FIG. 4 and FIG. 5, the cap member 40 has the through-hole 55 in the side surface 40B. The transmitting member 41 is fixed to the cap member 40 with a low melting point glass 42 disposed therebetween so as to cover the through-hole 55. The transmitting member 41 has a second surface 41B which rays of light emitted from the laser diodes 81, 82, and 83 enter and a first surface 41A from which the rays of light that have entered the second surface 41B are output to the outside of the optical module 1. The second surface 41B of the transmitting member 41 is joined to the cap member 40. As a result of joining of the cap member 40 to the stem 10 serving as a base member, the cap member 40 is deformed from its original shape. The deformation of the cap member 40 causes distortion and warpage on the transmitting member 41.

The area of a joining region through which the transmitting member 41 is joined to the cap member 40 is 60% or more of the area of the second surface 41B having the joining region. The area of the joining region is 80% or less of the area of the second surface 41B having the joining region. From the viewpoint of achieving high durability of the transmitting member 41, the area of the joining region is preferably 70% or more of the area of the second surface 41B having the joining region. From the viewpoint of providing a sufficient region through which emitted light passes, the area of the joining region is preferably 75% or less of the area of the second surface 41B having the joining region.

Figure 6:
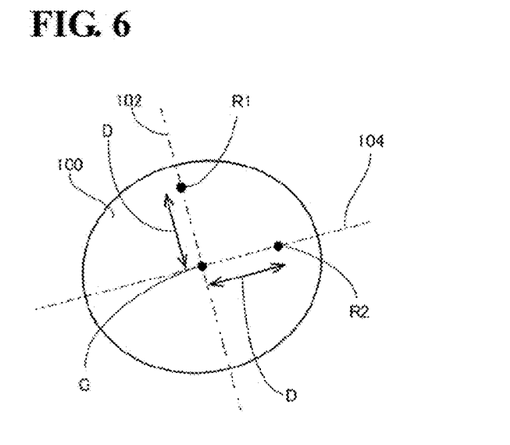
FIG. 6 illustrates a projection image of a transmitting member.
Figure 7:
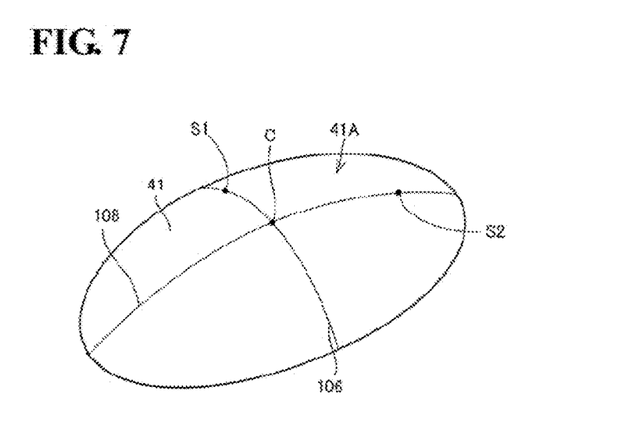
FIG. 7 schematically illustrates a first surface of the transmitting member.

Hereafter, the center of gravity G, first axis 102, second axis 104, central point C, first geodesic line 106, and second geodesic line 108 of a projection image (orthographic projection) 100 obtained by projecting the transmitting member 41 on a plane perpendicular to the optical axis of the optical module 1 will be described with reference to FIG. 6 and FIG. 7. FIG. 6 illustrates a projection image 100 of the transmitting member 41. FIG. 7 schematically illustrates the first surface 41A of the transmitting member 41. In FIG. 6, the center of gravity G of the projection image 100 obtained by projecting the transmitting member 41 on a plane perpendicular to the optical axis of the optical module 1 is illustrated. The center of gravity G is a point, on the projection image 100, obtained by projecting a central point C in FIG. 7 on a plane perpendicular to the optical axis of the optical module 1. That is, the central point C is a point, on the first surface 41A, corresponding to the center of gravity G.

The first axis 102 and the second axis 104 intersect each other orthogonally at the center of gravity G. The first axis 102 is a straight line, on the projection image 100, obtained by projecting a first geodesic line 106 of first surface 41A on a plane perpendicular to the optical axis of the optical module 1. That is, the first geodesic line 106 corresponds to the first axis 102. The second axis 104 is a straight line, on the projection image 100, obtained by projecting a second geodesic line 108 of the first surface 41A on a plane perpendicular to the optical axis of the optical module 1. That is, the second geodesic line 108 corresponds to the second axis 104.

The term "geodesic line" herein refers to a curved line that provides the minimum distance between two arbitrary points on a curved surface. When the transmitting member 41 has a flat-plate shape with main surfaces parallel to each other, the geodesic lines 106 and 108 on the main surfaces are straight lines. Herein, the first geodesic line 106 matches the first axis 102 and the second geodesic line 108 matches the second axis 104. When the transmitting member 41 has the first surface 41A with a curved-surface shape as illustrated in FIG. 7, the first geodesic line 106 and the second geodesic line 108 are curved lines. The first geodesic line 106 and the second geodesic line 108 intersect each other at the central point C on the first surface 41A.

Hereafter, the reference points R1 and R2 and the standard points S1 and S2 will be described with reference to FIG. 6 and FIG. 7. Referring to FIG. 6 and FIG. 7, the reference point refers to a point on the projection image 100 obtained by projecting the transmitting member 41 on a plane perpendicular to the optical axis of the optical module 1, the point being away from the center of gravity G of the projection image 100 by a particular distance D. In FIG. 6 and FIG. 7, a reference point on the first axis 102 is represented by the reference point R1. A reference point on the second axis 104 is represented by the reference point R2. The reference point R1 is a point, on the projection image 100, obtained by projecting the standard point S of the first surface 41A on a plane perpendicular to the optical axis of the optical module 1. That is, the standard point S1 corresponds to the reference point R1. The reference point R2 is a point, on the projection image 100, obtained by projecting the standard point S2 of the first surface 41A on a plane perpendicular to the optical axis of the optical module 1. That is, the standard point S2 corresponds to the reference point R2.

Displacement and Amount of Warp

Hereafter, the displacement and the amount of warp will be described with reference to FIG. 8. The displacement refers to, on the assumption that the height of one point on the first surface 41A in a state in which the transmitting member 41 is detached from the cap member 40 is zero and the direction toward the outside of the optical module 1 is a positive direction, a height of the one point in an optical axis direction in a state in which the transmitting member 41 is fixed to the cap member 40. The displacement will be specifically described with reference to FIG. 8. The state A indicated by a solid line is a state in which the transmitting member 41 is fixed to the cap member 40. The state B indicated by a broken line is a state in which the transmitting member 41 is detached from the cap member 40.

Figure 8:
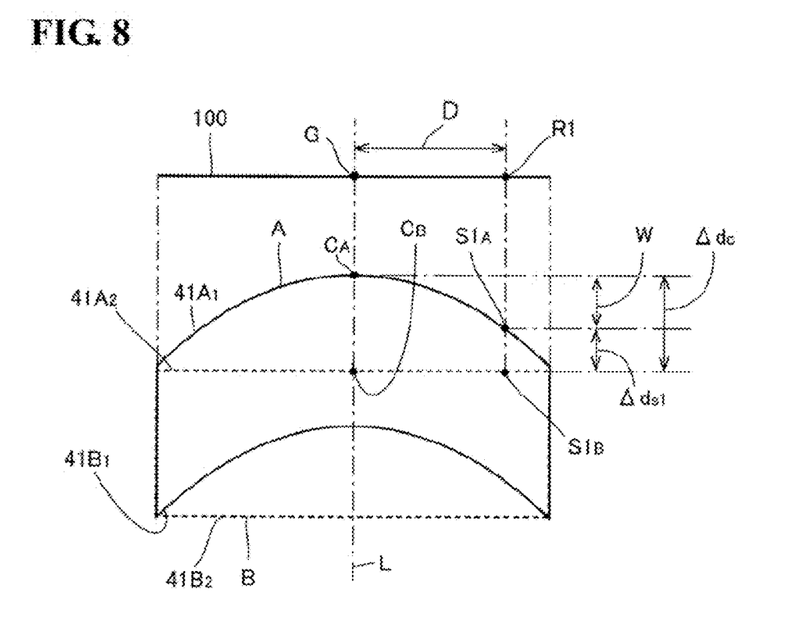
FIG. 8 is a schematic view for describing a displacement and an amount of warp.

Referring to FIG. 8, the standard point $S1_A$ is a point that is located on the first surface 41A of the transmitting member 41 in the state A and that corresponds to the reference point R1. The standard point $S1_B$ is a point that is located on the first surface 41A of the transmitting member 41 in the state B and that corresponds to the reference point R1. The central point $C_A$ is a point that is located on the first surface 41A of the transmitting member 41 in the state A and that corresponds to the center of gravity G. The central point $C_B$ is a point that is located on the first surface 41A of the transmitting member 41 in the state B and that corresponds to the center of gravity G. The optical axis L is an optical axis of the optical module 1. In FIG. 8, the first surface $41A_1$ in the state A and the first surface $41A_2$ in the state B are illustrated. Furthermore, the second surface $41B_1$ in the state A and the second surface $41B_2$ in the state B are illustrated.

In this embodiment, the displacement refers to, on the assumption that the height of one point on the first surface 41A in a state in which the transmitting member 41 is detached from the cap member 40 is zero and the direction toward the outside of the optical module 1 is a positive direction, a height of the one point in the optical axis L direction in a state in which the transmitting member 41 is fixed to the cap member 40. In FIG. 8, the displacement at the central point C is expressed as a height $\Delta d_c$ of the central point $C_A$ in the state A in which the transmitting member 41 is fixed to the cap member 40 on the assumption that the height of the central point Ca in the state B in which the transmitting member 41 is detached from the cap member 40 is zero. The displacement at the standard point S1 is expressed as a height $\Delta d_{s1}$ of the standard point $S1_A$ in the state A on the assumption that the height of the standard point $S1_B$ in the state B is zero.

The amount of warp is expressed as a difference W between the displacement $\Delta d_c$ at the central point C and the displacement $\Delta d_{S1}$ at the standard point S1.

In reality, the displacement and the amount of warp can be measured by the following procedure. First, the surface profile of the transmitting member 41 is observed in the state A in which the transmitting member 41 is fixed to the cap member 40 as illustrated in FIG. 5, and the height of each point in a particular region of the first surface $41A_1$ is measured. The surface profile of the transmitting member 41 can be observed and the height can be measured using a three-dimensional optical profiler. After the measurement, a temporary mark may be put so that the point C, on the first surface $41A_1$, corresponding to the center of gravity G provided when viewed in plan in the optical axis direction of the optical module 1 can be recognized.

Figure 9:
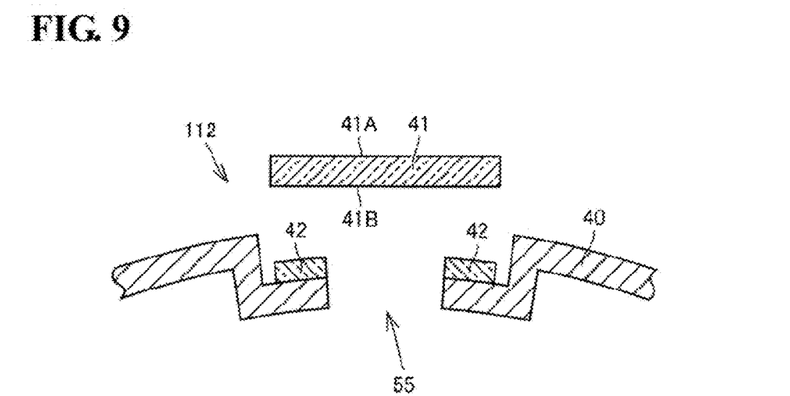
FIG. 9 is a schematic sectional view illustrating a state in which the transmitting member is detached in the structure in FIG. 5.

Then, the transmitting member 41 is detached from the cap member 40 by a detaching method such as the above-described physical method or thermal method. The transmitting member 41 can be detached from the cap member 40. FIG. 9 is a schematic sectional view illustrating a state in which the transmitting member 41 is detached in the structure in FIG. 5. The transmitting member 41 may be detached by a physical method such as a method in which a part of the low melting point glass is broken. Alternatively, the transmitting member 41 may be detached by a thermal method such as a method in which the temperature is increased to a temperature at which the low melting point glass melts but the transmitting member 41 does not deform.

In the state B in which the transmitting member 41 is detached from the cap member 40 as illustrated in FIG. 8, the height of each point in a particular region of the first surface $41A_2$ is measured in the same manner as above. Then, the displacement is calculated as, on the assumption that the height of one point on the first surface 41A in the state B is zero, a height of the one point in the optical axis L direction in the state A.

When the transmitting member is a flat plate, the measurement of the height in the state B in which the transmitting member 41 is detached from the cap member 40 may be omitted. The height in the state B in which the transmitting member 41 is detached from the cap member 40 can be considered to be zero over the entire first surface 41A. Therefore, the measurement of the height in the state B is omitted, and the amount of warp can be directly calculated from the observation of the surface profile and the measurement result of the height in the state A in which the transmitting member 41 is joined to the cap member 40.

The above-mentioned particular region can be set to, for example, a region of the first surface 41A that corresponds to a region, on the projection image 100, having a radius of 300 μm from the center of gravity G of the projection image 100 obtained by projecting the transmitting member 41 on a plane perpendicular to the optical axis L of the optical module 1.

The maximum amount of warp in the region of the first surface 41A that corresponds a region, on the projection image 100, having a radius of 300 μm from the center of gravity G is, for example, 0.03 μm or more and 0.15 μm or less. A geodesic line having the maximum amount of warp may be defined as the first geodesic line 106. The amount of warp is different between the first geodesic line 106 and the second geodesic line 108. This means that the distortion of the transmitting member 41 is uneven (non-concentric). The maximum amount of warp is preferably 0.05 μm or more from the viewpoint of improving airtightness (sealing property). The maximum amount of warp is preferably 0.13 μm or less from the viewpoint of suppressing cracking of the transmitting member 41.

Figure 10:
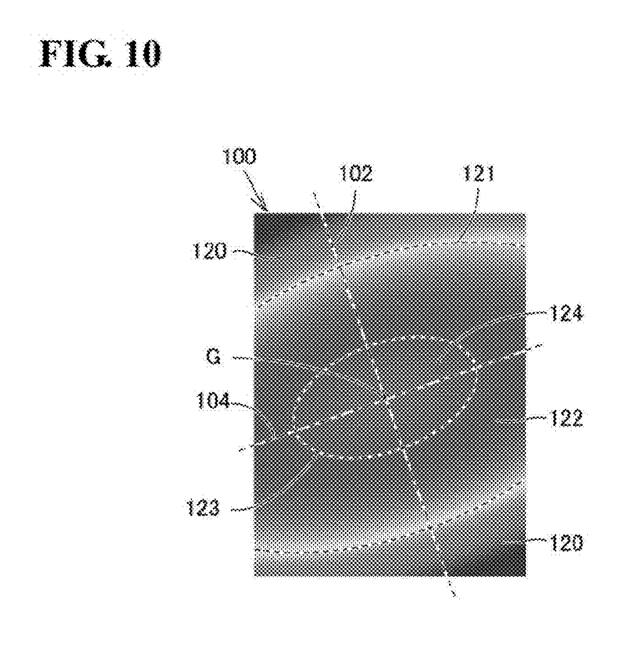
FIG. 10 illustrates an example of the measurement result of a surface profile of the transmitting member with a three-dimensional optical profiler.

FIG. 10 illustrates an example of the measurement result of the surface profile of the transmitting member 41 with a three-dimensional optical profiler. In FIG. 10, contour lines 121 and 123 are illustrated on the projection image 100 obtained by projecting the transmitting member 41 on a plane perpendicular to the optical axis L of the optical module 1. The point G is a center of gravity of the projection image 100. In FIG. 10, the first axis 102 corresponding to the first geodesic line 106 and the second axis 104 corresponding to the second geodesic line 108 are also illustrated. In FIG. 10, a region 120 having a negative height is illustrated outside the contour line 121 in the radial direction. The height increases in the radially inward direction from the region 120 toward the center of gravity G in the order of a region 122 and a region 124.

Figure 11:
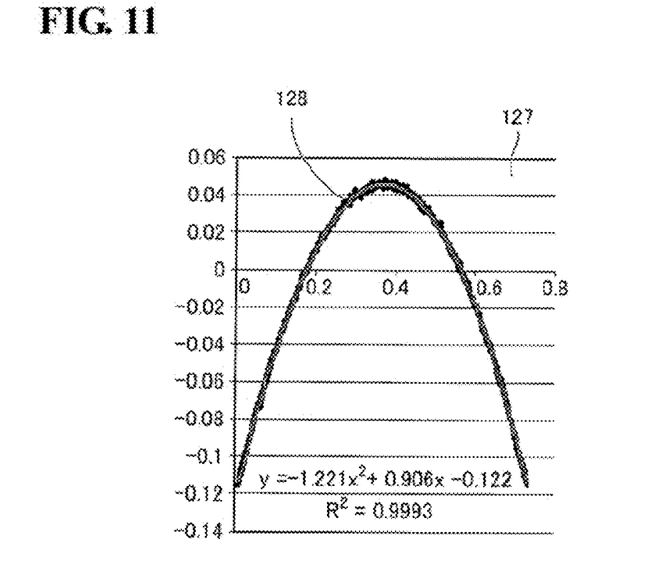
FIG. 11 is a chart illustrating the measurement result of the height on a first geodesic line of the transmitting member.
Figure 12:
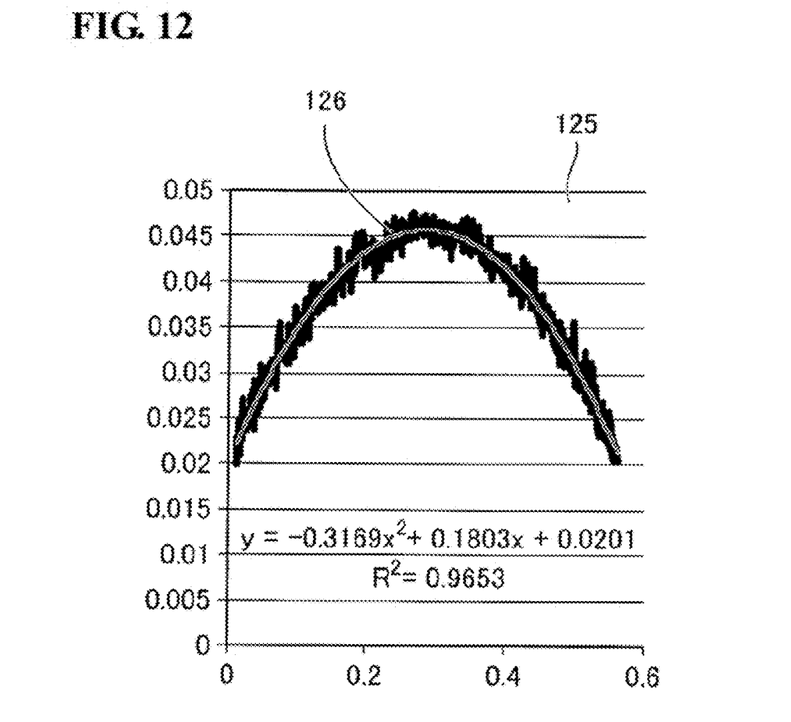
FIG. 12 is a chart illustrating the measurement result of the height on a second geodesic line of the transmitting member.

FIG. 11 is a chart illustrating the measurement result of the height on the first geodesic line of the transmitting member 41. By continuously measuring the height of the transmitting member 41 on the first surface 41A along the first geodesic line 106, a continuous curved line illustrated in FIG. 11 is drawn. This curved line corresponds to a surface profile of the first surface 41A in a sectional view of the transmitting member 41 taken along the first geodesic line 106. FIG. 12 is a chart illustrating the measurement result of the height on the second geodesic line 108 of the transmitting member 41. By continuously measuring the height of the transmitting member 41 on the first surface 41A along the second geodesic line 108, a continuous curved line illustrated in FIG. 12 is drawn. This curved line corresponds to a surface profile of the first surface 41A in a sectional view of the transmitting member 41 taken along the second geodesic line 108. In the vertical axis in FIG. 11 and FIG. 12, the direction toward the outside of the optical module 1 along the optical axis L is a positive direction. In FIG. 11 and FIG. 12, the amount of warp can be determined from the difference in height between the central point C, on the first surface 41A, corresponding to the center of gravity G of the projection image obtained by projecting the transmitting member 41 on a plane perpendicular to the optical axis L of the optical module 1 and a point (e.g., standard point S1), on the first surface 41A, corresponding to a point (e.g., reference point R1), on the projection image, 300 μm in radius away from the center of gravity G. When the profile in FIG. 11 and FIG. 12 is concave downward, the amount of warp is positive. When the profile is concave upward, the amount of warp is negative.

Figure 13:
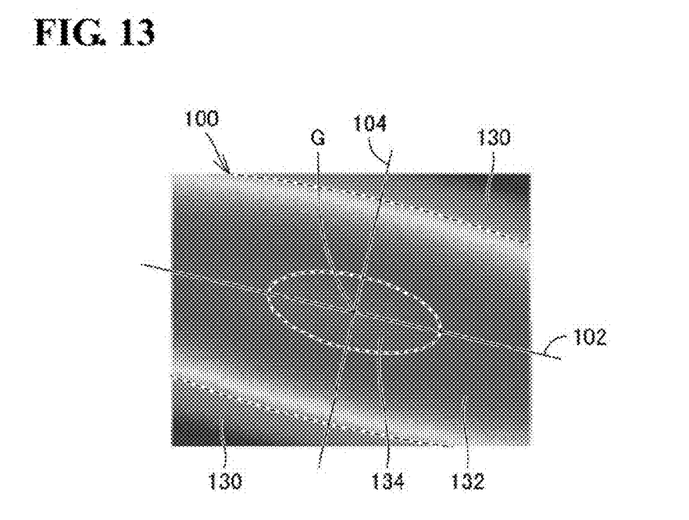
FIG. 13 illustrates an example of the measurement result of a surface profile of the transmitting member with a three-dimensional optical profiler.
Figure 14:
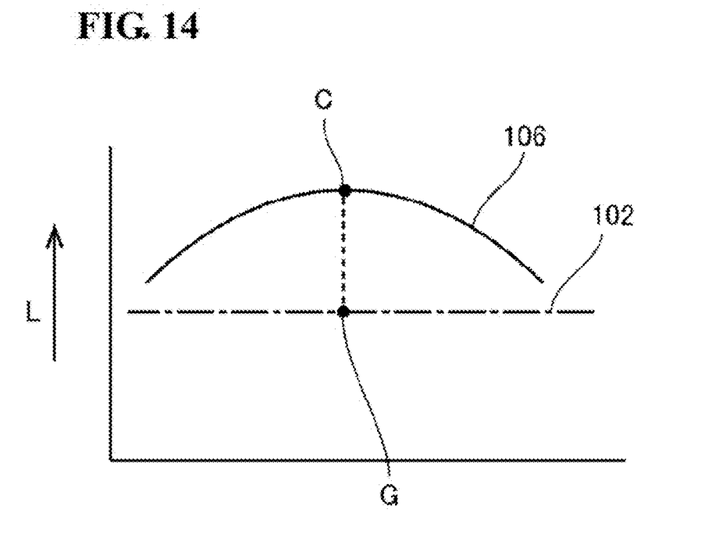
FIG. 14 schematically illustrates the shape of the first geodesic line.
Figure 15:
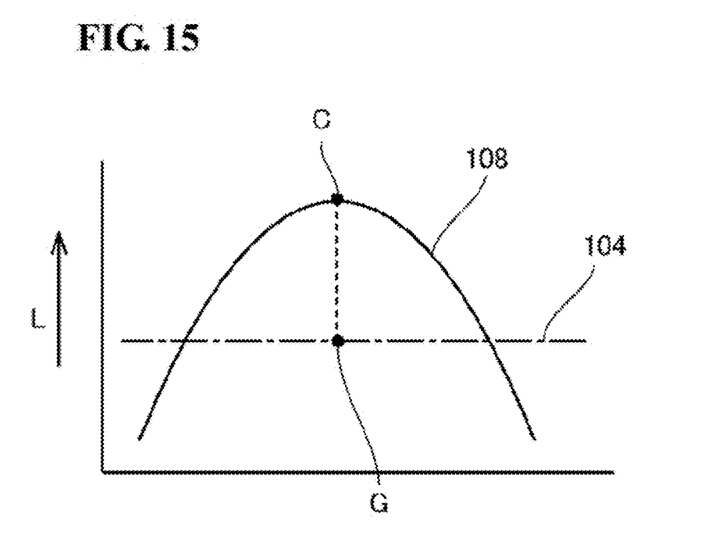
FIG. 15 schematically illustrates the shape of the second geodesic line.

FIG. 13 illustrates an example of the measurement result of the surface profile of the transmitting member 41 measured through the above-described procedure using a three-dimensional optical profiler. A region 130 has a negative height. The height increases in the radially inward direction from the region 130 toward the center of gravity G in the order of a region 132 and a region 134. FIG. 14 schematically illustrates the shape of the first geodesic line 106. FIG. 15 schematically illustrates the shape of the second geodesic line 108. When the profile in FIG. 14 and FIG. 15 is concave downward, the amount of warp is positive. When the profile is concave upward, the amount of warp is negative. Referring to FIG. 14 and FIG. 15, the transmitting member 41 in FIG. 13 has a positive amount of warp on both the geodesic line 106 and the geodesic line 108.

Figure 16:
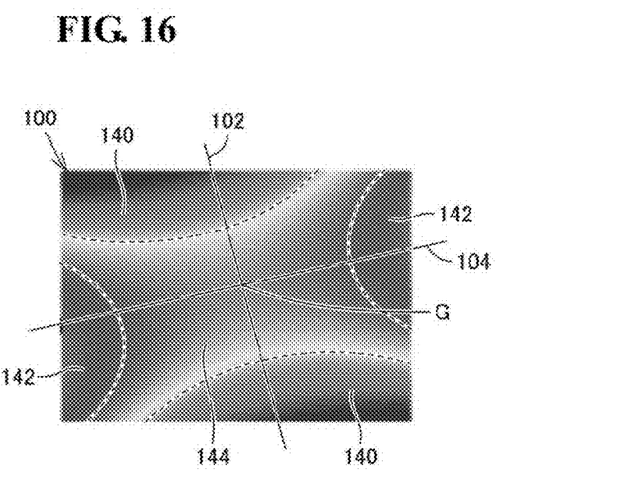
FIG. 16 illustrates an example of the measurement result of a surface profile of the transmitting member with a three-dimensional optical profiler.
Figure 17:
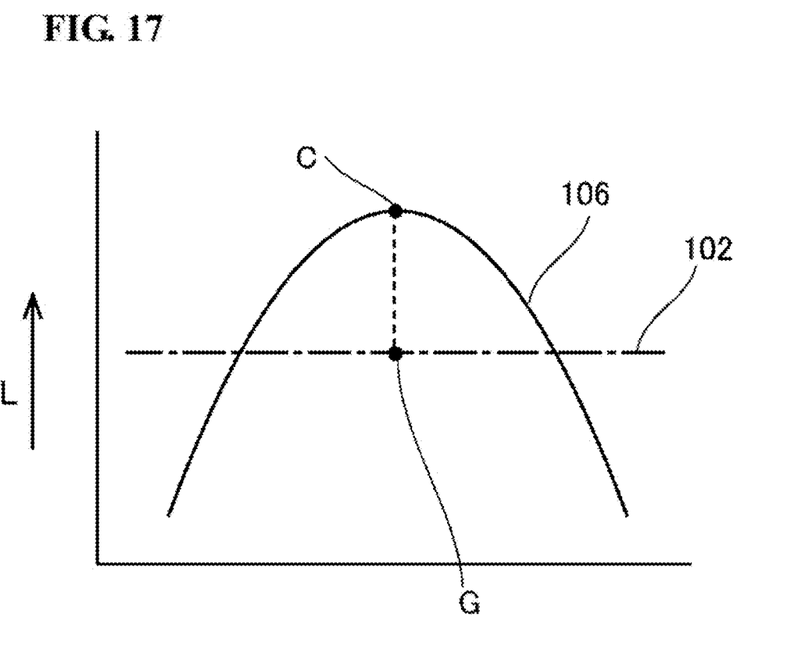
FIG. 17 schematically illustrates the shape of the first geodesic line.
Figure 18:
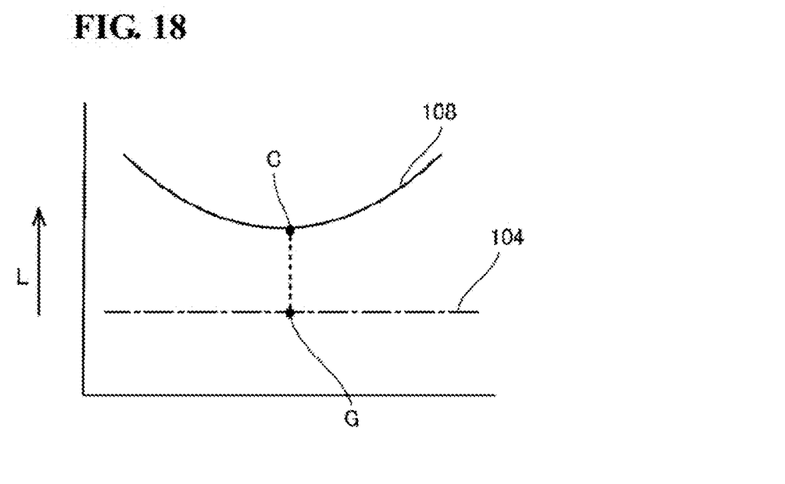
FIG. 18 schematically illustrates the shape of the second geodesic line.

FIG. 16 illustrates another example of the measurement result of the surface profile of the transmitting member 41 measured through the above-described procedure using a three-dimensional optical profiler. A region 140 has a negative height. The height of a region 144 including the center of gravity G is larger than that of the region 140, but is smaller than that of a region 142. The region 142 has the largest height of all the regions in FIG. 16. FIG. 17 schematically illustrates the shape of the first geodesic line 106. FIG. 18 schematically illustrates the shape of the second geodesic line 108. When the profile in FIG. 17 and FIG. 18 is concave downward, the amount of warp is positive. When the profile is concave upward, the amount of warp is negative. Referring to FIG. 17 and FIG. 18, the transmitting member 41 in FIG. 16 has a positive amount of warp on the geodesic line 106 but a negative amount of warp on the geodesic line 108. That is, the transmitting member 41 in FIG. 16 is distorted into a saddle-like shape.

This embodiment has been described above. The submounts 71, 72, and 73 are formed of a material having a thermal expansion coefficient close to that of devices and the like mounted on the submounts 71, 72, and 73. For example, the submounts 71, 72, and 73 may be formed of AlN, SiC, Si, or diamond. The stem 10 and the cap member 40 are preferably formed of, for example, a material having a high thermal conductivity or a low thermal expansion coefficient. The stem 10 and the cap member 40 may be formed of, for example, iron, copper, nickel, or an alloy of the foregoing, or AlN, CuW, or CuMo.

In the above embodiment, the case where the transmitting member 41 is joined at the second surface 41B has been described. However, the transmitting member 41 may be joined at the first surface 41A. The case where a low melting point glass 42 is used as a joining member has also been described, but other joining members or adhesives may be used.

In the above embodiment, the optical module 1 including, as optical semiconductor devices, the three laser diodes 81, 82, and 83 that emit rays of light having different wavelengths has been described. However, the types and number of optical semiconductor devices are not particularly limited. The optical module 1 may include light-receiving devices as optical semiconductor devices, instead of the laser diodes serving as light-emitting devices. Furthermore, for example, light-emitting diodes may be employed as light-emitting devices, instead of the laser diodes 81, 82, and 83. In the above embodiment, the case where the wavelength selective filters are employed as the first filter 97 and the second filter 98 has been described. However, these filters may be, for example, polarization synthesizing filters. These filters may be omitted as needed.

As described above, in the optical module according to this embodiment, the amount of warp is different between the first geodesic line and the second geodesic line. That is, the transmitting member is unevenly distorted in a non-concentric manner.

In the optical module according to this embodiment, the transmitting member is joined to the cap member at the first surface or the second surface. Thus, cracking of the transmitting member is suppressed despite the fact that the transmitting member has uneven distortion in the optical module.

EXAMPLES

A bottom-face support type optical module in which a transmitting member was joined to a cap member at a surface light enters was provided, and the presence or absence of warping and cracking on the transmitting member was checked. For comparison, a comparative side-face support type optical module in which a transmitting member was joined to a cap member at a side surface (peripheral surface) of the transmitting member was provided, and the presence or absence of warping and cracking on the transmitting member was checked in the same manner. Furthermore, the presence or absence of leaks in the optical module was checked.

The evaluation was conducted as follows.

Amount of Warp of Transmitting Member

The amount of warp of the transmitting member 41 in a region of the first surface 41A that corresponds to a region having a radius of 300 μm from the center of gravity G on the projection image 100 obtained by projecting the transmitting member 41 on a plane perpendicular to the optical axis L of the optical module 1 was measured using a three-dimensional optical profiler (manufactured by Canon Inc.). In this Example, the first geodesic line and the second geodesic line were set so that a geodesic line having the maximum amount of warp among geodesic lines that pass through the central point C was defined as a first geodesic line.

Observation of Cracking on Transmitting Member

The presence or absence of cracking on the transmitting member was observed using a stereoscopic microscope after a durability test of a transmission window. The durability test was conducted as follows. First, 50 cycles (1 cycle=1 hour) of a −40° C./85° C. heat cycle test was repeatedly performed. Then, a high temperature/humidity exposure test at 85° C./85% was performed for 50 hours.

Presence or Absence of Leaks

The presence or absence of leaks was judged with a helium leak test (acceptable criterion: leak rate<$1 \times 10^{-10}$ Pa·m$^3$/s).

Table shows the evaluation results. In Table, No. 1 refers to Comparative Example, No. 2 refers to First Example, and No. 3 refers to Second Example. Evaluation was performed on 13 samples of each of Comparative Example, First Example, and Second Example. In Table, the amount of warp on the first geodesic line and the amount of warp on the second geodesic line are an average of the 13 samples.

Figure 19:
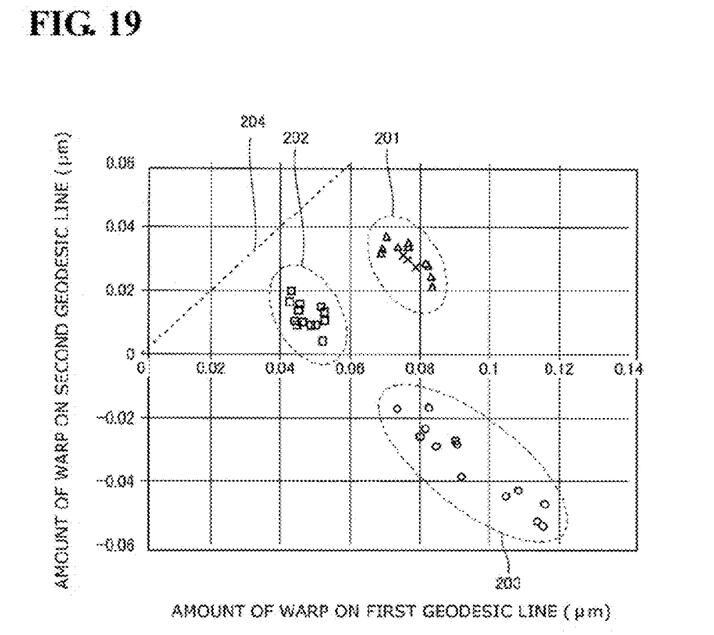
FIG. 19 is a graph illustrating the relationship between the amount of warp of the transmitting member and the presence or absence of occurrence of cracking on the transmitting member.

FIG. 19 is a graph illustrating the relationship between the amount of warp and the occurrence frequency of cracking in the transmitting member. In the graph in FIG. 19, the horizontal axis represents the amount of warp (μm) on the first geodesic line. The vertical axis represents the amount of warp (μm) on the second geodesic line. For the plotted data, a group 201 is a data group of Comparative Example. A group 202 is a data group of First Example and a group 203 is a data group of Second Example. A broken line 204 is a hypothetical line indicating the case where the amount of warp in the first-axis direction and the amount of warp in the second-axis direction are the same. Plotting on the broken line 204 indicates that the distortion of the transmitting member is evenly distributed in a concentric manner. An increase in the distance between the plot and the broken line 204 indicates larger distortion and unevenness.

TABLE

|  | No. | | |
| --- | --- | --- | --- |
|  | 1 | 2 | 3 |
| Number of tests | 13 | 13 | 13 |
| Joining state of transmitting member | Side-face support | Bottom-face support | Bottom-face support |
| Amount of warp on first geodesic line | 0.077 μm | 0.048 μm | 0.095 μm |
| Amount of warp on second geodesic line | 0.030 μm | 0.012 μm | −0.034 μm |
| Number of occurrences of cracking on transmitting member | 3/13 | 0/13 | 0/13 |
| Number of passes for leak test | 10/13 | 12/13 | 13/13 |

Referring to FIG. 19 and Table, as shown in the data group 201 of Comparative Example, cracking (x marks in FIG. 19)

was observed in 3 samples out of the 13 samples in the optical module in which the transmitting member was joined to the cap member at the side surface of the transmitting member. In the case where the transmitting member is joined to the cap member at the side surface of the transmitting member as described above, if the warping of the transmitting member unevenly occurs, cracking may occur. Furthermore, leakage was observed in 3 samples out of the 13 samples.

In contrast, referring to Table and FIG. 19, as shown in the data group 202 of First Example, cracking on the transmitting member was not observed in any of the samples in the optical module of First Example in which the transmitting member was joined to the cap member at the surface light enters.

The optical module of Second Example was provided by changing the welding conditions of the base member and the cap member from those in First Example. Specifically, the welding voltage was increased to reinforce the joining. The data group 203 of Second Example in FIG. 19 was present at the lower right of the graph in a dotted manner. As illustrated in FIG. 19, the data group 203 was located away from the broken line 204 toward a lower right position. That is, the transmitting member of Second Example had a highly distorted shape. Furthermore, the transmitting member of Second Example had a positive amount of warp on the first geodesic line, but a negative amount of warp on the second geodesic line (refer to Table and FIG. 19). This shows that the transmitting member of the optical module of Second Example had a highly distorted saddle-like shape. Despite the highly distorted shape, cracking was not observed on the transmitting member of Second Example as shown in Table. Furthermore, in the optical module of Second Example, the distortion of the transmitting member was increased by reinforcing the joining, but the airtightness was improved. Consequently, leakage was suppressed in all the test samples (refer to Table).

In the transmitting members of First and Second Examples, the area of the joining region, which was a region joined to the cap member, was 74% of the area of a surface of the transmitting member having the joining region. When the joining region has such an area, the adhesive area is sufficiently large and thus cracking was suppressed with more certainty. Furthermore, by employing such joining, troubles concerning mechanical reliability, such as detachment of the transmitting member from the cap member, did not occur.

It was confirmed from the above results that even if the warping of the transmitting member was uneven, cracking could be suppressed in the optical module according to an embodiment of the present invention. It was also confirmed that even if the distortion of the transmitting member was increased by changing the welding conditions, cracking of the transmitting member could be suppressed in the optical module according to an embodiment of the present invention.

Embodiments and Examples disclosed herein are mere examples in all respects and should be understood as placing no limitations in any perspective. The scope of the present invention is defined not by the above description, but by claims. The scope of the present invention is intended to embrace equivalents of the claims and all the modifications within the claims.

What is claimed is:

1. An optical module comprising:
    a main member including an optical semiconductor device; and
    a protective member that surrounds the main member, wherein the protective member includes:
        a base member that supports the main member,
        a cap member that has a through-hole, covers the main member, and is joined to the base member, and
        a transmitting member fixed to the cap member so as to cover the through-hole and formed of a material that transmits light with a wavelength corresponding to the optical semiconductor device,
    the transmitting member has a first surface and a second surface which light enters or from which light is output,
    in a case where a first axis and a second axis are set that are orthogonal to each other at a center of gravity of a projection image obtained by projecting the transmitting member on a plane perpendicular to an optical axis of the optical module, a geodesic line on the first surface corresponding to the first axis is defined as a first geodesic line, a geodesic line on the first surface corresponding to the second axis is defined as a second geodesic line, and a point on the first surface corresponding to the center of gravity is defined as a central point, when a height of one point on the first surface in a state in which the transmitting member is detached from the cap member is zero and a direction toward an outside of the optical module is a positive direction, an amount of warp that is a difference between a displacement at the central point and a displacement at a standard point, on the first surface, corresponding to a reference point, on the projection image, away from the center of gravity by a particular distance is different between the first geodesic line and the second geodesic line, the displacement being a height of the one point in a direction of the optical axis in a state in which the transmitting member is fixed to the cap member, and
    the transmitting member is joined to the cap member at the first surface or the second surface.

2. The optical module according to claim 1, wherein the transmitting member is formed of glass.

3. The optical module according to claim 1,
    wherein the cap member has a side surface including a region joined to the base member and a top surface connected to the side surface at a region opposite to the region joined to the base member, and
    the through-hole is formed in the side surface.

4. The optical module according to claim 3, wherein the cap member has a hollow rectangular parallelepiped shape having an opening at one surface.

5. The optical module according to claim 1, wherein a maximum value of the amount of warp in a region, on the first surface, corresponding to a region, on the projection image, having a radius of 300 μm from the center of gravity of the projection image is 0.03 μm or more and 0.15 μm or less.

6. The optical module according to claim 1, wherein both of an amount of warp on the first geodesic line and an amount of warp on the second geodesic line are positive or negative.

7. The optical module according to claim 1, wherein one of an amount of warp on the first geodesic line and an amount of warp on the second geodesic line is positive, and the other is negative.

8. The optical module according to claim 1, wherein the transmitting member is joined to the cap member with a low melting point glass disposed therebetween.

9. The optical module according to claim 1, wherein in the transmitting member, an area of a joining region that is a region joined to the cap member is 60% or more of an area of a surface having the joining region, the surface being one of the first surface and the second surface.

10. The optical module according to claim 1, wherein in the transmitting member, an area of a joining region that is a region joined to the cap member is 80% or less of an area of a surface having the joining region, the surface being one of the first surface and the second surface.

11. The optical module according to claim 1, wherein the optical semiconductor device is a laser diode.

* * * * *